(12) United States Patent
Kim et al.

(10) Patent No.: US 6,975,535 B2
(45) Date of Patent: Dec. 13, 2005

(54) ELECTRONIC MEMORY, SUCH AS FLASH EPROM, WITH BITWISE-ADJUSTED WRITING CURRENT OR/AND VOLTAGE

(75) Inventors: Youngweon Kim, San Jose, CA (US); Li-Chun Li, Los Gatos, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 91 days.

(21) Appl. No.: 10/640,928

(22) Filed: Aug. 14, 2003

(65) Prior Publication Data

US 2005/0036346 A1 Feb. 17, 2005

(51) Int. Cl.[7] .......................... G11C 16/04; G11C 16/06
(52) U.S. Cl. ............................ 365/185.09; 365/185.29
(58) Field of Search ...................... 365/185.09, 185.18, 365/185.24, 185.29

(56) References Cited

U.S. PATENT DOCUMENTS

| | | | |
|---|---|---|---|
| 5,675,537 A | * 10/1997 | Bill et al. ............. | 365/185.29 |
| 5,789,297 A | 8/1998 | Wang et al. ................ | 438/267 |
| 5,818,761 A | * 10/1998 | Onakado et al. ......... | 365/185.18 |
| 6,355,524 B1 | 3/2002 | Tuan et al. .................. | 438/257 |
| 6,535,431 B1 | * 3/2003 | Pio et al. ................ | 365/185.24 |
| 6,562,681 B2 | 5/2003 | Tuan et al. .................. | 438/257 |
| 6,584,018 B2 | 6/2003 | Tuan et al. ............ | 365/185.28 |
| 6,674,669 B2 | 1/2004 | Tuan et al. ............ | 365/185.28 |

* cited by examiner

*Primary Examiner*—Trong Phan
(74) *Attorney, Agent, or Firm*—Ronald J. Meetin

(57) ABSTRACT

A memory such as a flash EPROM contains writing circuitry (58 and 60) that adjusts how much current or/and voltage is provided to a writing conductor (92) connected to the memory cells (50) of a cell group for simultaneously writing the bits of a bit group such as a word or byte into the cells of that cell group as a function of how many of those bits are in one of a pair of opposite logic states.

60 Claims, 5 Drawing Sheets

ELECTRONIC MEMORY, SUCH AS FLASH EPROM, WITH BITWISE-ADJUSTED WRITING CURRENT OR/AND VOLTAGE

FIELD OF USE

This invention relates to electronic memories, especially erasable programmable read-only memories ("EPROMs") of the flash-erasable type.

BACKGROUND ART

Semiconductor memories are formed with memory cells that store bits of data. Various terms such as word and byte are utilized to describe the data stored in certain groups of memory cells. When information is being read out of a semiconductor memory, all the bits that form such a group are normally read simultaneously out of the cells containing those bits. Similarly, if a semiconductor memory is a rewritable memory in that data can be written into each memory cell multiple times, all the bits that form a bit group such as a word or a byte are normally written simultaneously into the memory.

Referring to the drawings, FIG. 1 illustrates the basic architecture for a conventional rewritable semiconductor memory in which all the bits that form a word, byte, or other such bit group are written simultaneously. The memory in FIG. 1 is a flash EPROM of the type generally described in U.S. Pat. No. 6,355,524. Data is stored in a multiplicity of memory cells 20 arranged in rows and columns. Each memory cell 20 is an n-channel split-gate floating-gate field-effect transistor ("FET") having source S, drain D, floating gate FG, overlying control gate CG, and select gate SG.

Each memory cell 20 is conventionally defined to be in a low logic, or "0", state when the threshold voltage of the cell's floating-gate FET is sufficiently high that the FET is turned off when a nominal control voltage is applied between control gate CG and source S and a nominal access voltage is simultaneously applied between select gate SG and source S. The logic "0" state is achieved by introducing electrons onto floating gate FG to raise the threshold voltage in a programming operation. Each cell 20 is then conventionally defined to be in a high logic, or "1", state when the threshold voltage is sufficiently low that application of a nominal control voltage between control gate CG and source S accompanied by simultaneous application of a nominal access voltage between select gate SG and source S causes the FET to turn on. The logic "1" state is achieved by removing electrons from floating gate FG to lower the threshold voltage in an erase operation. Cells 20 that store the bits of a word or byte are situated in a row of cells 20.

Memory cells 20 are addressed through row decoder 22 and column decoder 24. The EPROM of FIG. 1 further includes write buffer 26, sense amplifiers 28, read buffer 30, and input/output circuitry/pins 32 through which the EPROM interacts with the outside world. Row decoder 22 accesses the rows of cells 22 through word lines 34 connected to select gates SG. In addition, decoder 22 is connected to sources S through source lines 36, to control gates CG through control lines 38, and to the cell channel regions through body lines 40. Column decoder 24 accesses the columns of cells 20 through bit lines 42 connected to drains D. A particular group of cells 20 in a row is selected for a read or write operation by utilizing decoder 22 to select the row and utilizing decoder 24 to select the columns having those cells 20.

The EPROM of FIG. 1 receives a pair of supply voltages between which the memory operates during read operations. A write operation is performed by first erasing all of memory cells 20 to logic "1". A programming operation is then performed on selected cells 20 to write logic "0" simultaneously into those cells 20 by providing their control gates CG and either sources S or drains D with programming voltages considerably greater than the higher of EPROM's two supply voltages for introducing electrons onto their floating gates FG to raise their threshold voltages to the "0" level.

The programming voltages are supplied from internal high-voltage generation circuitry (not separately shown in FIG. 1) and are transmitted along control lines 38 and either source lines 36 or bit lines 42 to memory cells 20. However, voltage losses occur along the circuitry, including lines 38 and either lines 36 or lines 42, that connect the high-voltage generation circuitry to cells 20. Since all the bits in a bit group such as a word or byte are written simultaneously into the EPROM of FIG. 1 and since the number of cells 20 programmed to logic "0" varies from zero to all of the bits in the bit group, the voltage losses commonly vary with the number of cells 20 being programmed to "0".

In some instances, the variance of the voltage losses with the number of memory cells being programmed to logic "0" may cause the programming voltages to be too high or too low to achieve proper programming. If a programming voltage is too high, the threshold voltages of certain memory cells 20 may be raised too much. This "overprogramming" can lead to incomplete erasure during subsequent operation. Also some of cells 20 may undergo damage due to resultant source-to-body pn junction breakdown or/and gate dielectric breakdown.

If a programming voltage is too low, certain of memory cells 20 may not have their voltages raised sufficiently to reach logic "0". As a result of this "underprogramming", those cells 20 may be incorrectly determined to contain logic "1" during read operations. It is desirable to be able to write information into a memory such as EPROM in such a way that the accuracy of the write operation is largely independent of the logic states of the bits being simultaneously written into the memory.

GENERAL DISCLOSURE OF THE INVENTION

The present invention furnishes a memory in which the current or/and voltage utilized in writing bits of a bit group such as a word or a byte into cells of the memory is adjusted as a function of how many of those bits are in one of a pair of opposite logic states. As a result, the accuracy of simultaneously writing the bits of the bit group into the appropriate memory cells is largely independent of the logic states of those bits. The writing accuracy is improved substantially.

More particularly, a memory in accordance with the invention contains a multiplicity of memory cells, a plurality of writing conductors, and writing circuitry. The memory cells are allocated into multiple cell groups each containing two or more cells for storing bits of a bit group. Each bit is in a first logic state or a second logic state opposite to the first logic state. All the cells in each cell group are connected to an associated one of the writing conductors.

The writing circuitry adjusts how much current or/and voltage is provided to each writing conductor for simultaneously writing the bits of a bit group into the cells of a cell group associated with that writing conductor as a function of how many of those bits are in the first logic state. This adjustment action enables a more suitable level of writing current or/and voltage to be achieved, thereby reducing instances of writing errors.

The writing circuitry typically contains a calculating circuit and an adjusting circuit. The calculating circuit utilizes a plurality of integer sets, each containing at least one integer. The integers in any integer set having multiple integers are consecutive integers such as 1, 2, and 3.

The integers in all of the integer sets together normally run sequentially from zero to the number of bits in each bit group. For instance, if each bit group contains n bits, the integers in all the integer sets normally consist of the n+1 integers 0, 1, 2 . . . n. These integers are then allocated into the indicated integer sets. Each integer in each set is preferably different from each integer in each other set. The number of integer sets normally ranges from two to one greater than the number of bits in each bit group.

When the bits of a bit group are to be simultaneously written into a cell group, the calculating circuit determines the particular integer set which contains an integer equal to the number of those bits in the first logic state. The calculating circuit provides a calculation signal indicative of this determination. The adjusting circuit then supplies current or/and voltage to the associated writing conductor at a current amount or/and voltage amount adjusted in response to the calculation signal.

Increasing the number of integer sets generally improves the writing accuracy. However, increasing the number of integer sets may increase the amount of circuitry needed to implement the adjustment function. In some cases, only a small increase in accuracy may be obtained by increasing the number of integer sets beyond a certain number. Since the number of integer sets can vary from two to one greater than the number of bits in each bit group, the number of integer sets in a particular implementation of the present memory can be chosen to achieve a good trade-off between improved writing accuracy and keeping the amount of circuitry low.

The adjusting circuit typically has a writing supply terminal selectively electrically connectable to each writing conductor. Current or/and voltage for simultaneously writing the bits of a bit group into a cell group associated with a writing conductor is/are provided at the writing supply terminal for that writing conductor.

The adjusting circuit can be primarily directed toward adjusting the current at the writing supply terminal or toward adjusting the voltage at the writing supply terminal. In a current-adjusting implementation, the adjusting circuit contains a plurality of current-supply components having respective supply conductors coupled together and to the writing supply terminal for providing current at the writing supply terminal. Each current-supply component provides its supply conductor with a non-zero supply current in response to a specified condition of a corresponding component signal of the calculation signal. In a voltage-adjusting implementation, the adjusting circuit regulates the voltage at the writing supply terminal to compensate for voltage losses in circuitry that selectively couples the writing supply terminal to the writing conductors such that the voltage on each writing conductor is approximately the same regardless of how many bits in a bit group being simultaneously written into a cell group along that writing conductor are in the first logic state.

The present memory is typically an EPROM, e.g., a flash EPROM whose memory cells are erased before writing data into them. In that case, the current and voltage at the writing supply terminal are programming parameters. The invention avoids difficulties that arise from underprogramming and overprogramming in conventional flash EPROMs. Consequently, the invention provides a substantial advance over the prior art.

Figure 1:
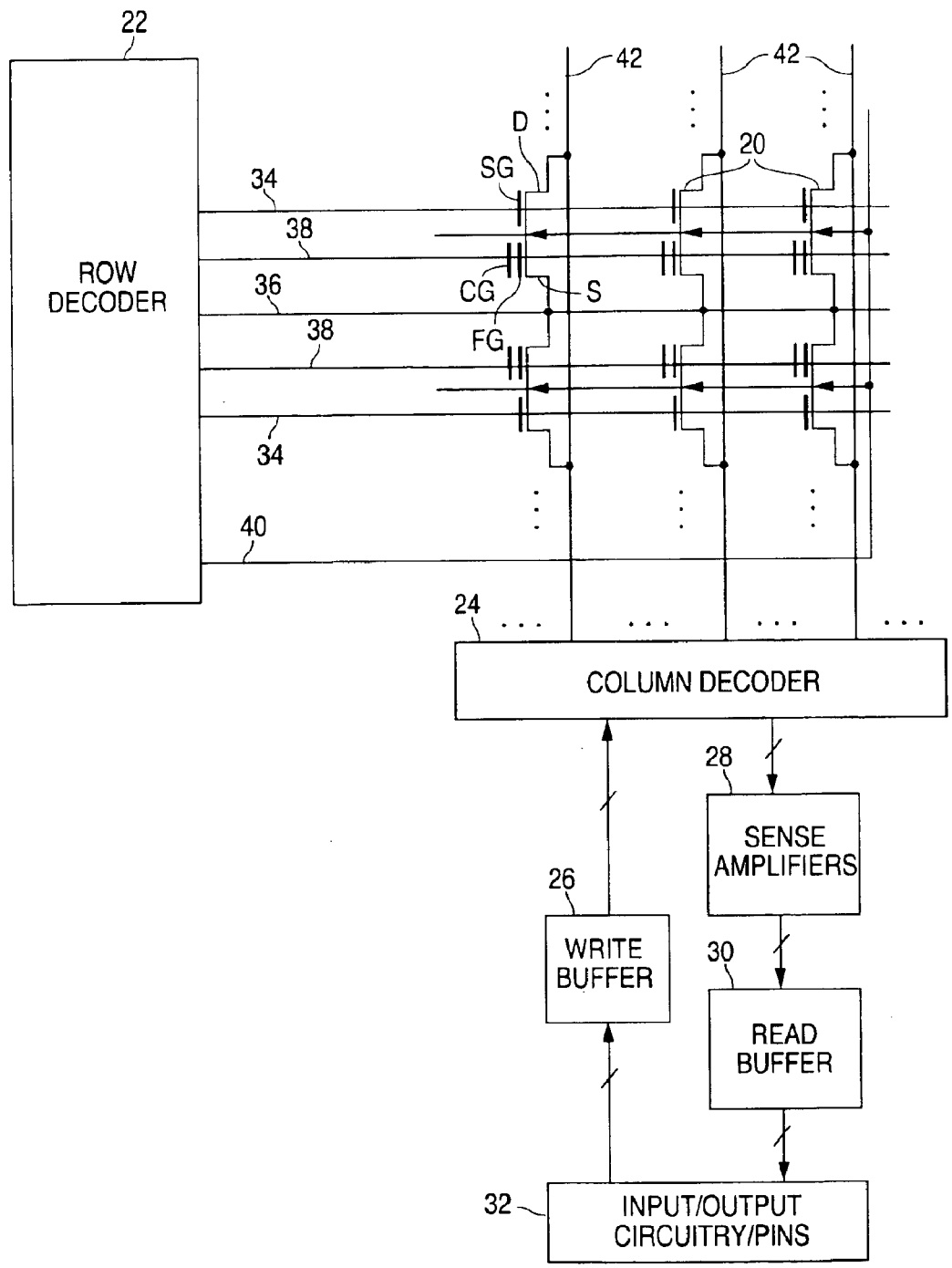
FIG. 1 is a block/circuit diagram of a conventional flash EPROM.

Like reference symbols are employed in the drawings and in the description of the preferred embodiments to represent the same, or very similar item, or items. Each line provided with a slash in the drawings represents multiple electrical lines or conductors. Some of the electrical conductors shown in the drawings are furnished with arrowheads to indicate the directions in which signals travel on those conductors.

DESCRIPTION OF THE PREFERRED EMBODIMENTS

In the following description, "connected" means electrically connected unless otherwise indicated. Similarly, "line" means an electrical line or conductor. All FETs described below are n-channel insulated-gate FETs except as otherwise indicated.

Figure 2:
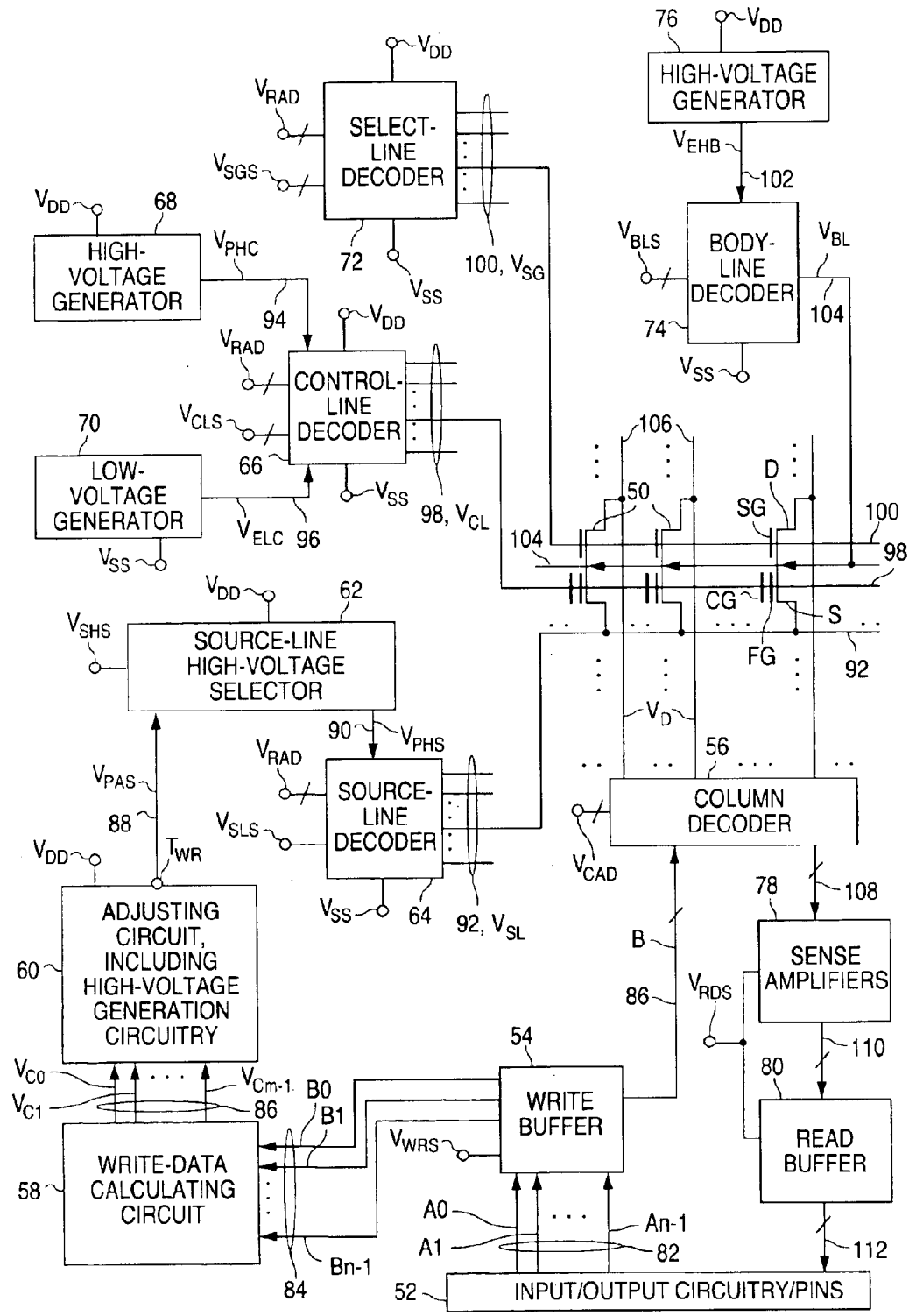
FIG. 2 is a block/circuit diagram of a flash EPROM having bitwise-adjusted programming current or/and voltage in accordance with the invention.

FIG. 2 illustrates a flash EPROM configured in accordance with the invention to have programming current or/and voltage that is automatically adjusted according to the logic states of bits being simultaneously written into the EPROM. The core of the EPROM in FIG. 2 is a multiplicity of largely identical memory cells 50 arranged in rows and columns. Memory cells 50 respectively store bits of data where each bit is either a high logic "1" value or a low logic "0" value.

Three of memory cells 50 in a row are depicted in FIG. 2. The three illustrated cells 50 are part of a cell group that stores a bit group whose bits are simultaneously written into, and read out of, the cell group. Such a bit group is referred to here as a "unitary" bit group to distinguish it from any other bit group whose bits can be written into, or read out of, the EPROM at two or more separate times. Examples of unitary bit groups include words and bytes. A cell group that stores a unitary bit group is referred to here as a "unitary" cell group.

The three illustrated memory cells 50 in FIG. 2 can, for example, be the first, second, and last cells in a unitary cell group. The last illustrated cell 50 is the eighth in the case of an 8-bit byte, the sixteenth in the case of a 16-bit word, and so on. Cells 50 in a unitary cell group that stores consecutive bits of a unitary bit group are typically spaced regularly apart from one another by other cell groups that each contain a fixed number of one or more cells 50. In an example where the first two illustrated cells 50 in FIG. 2 represent the first two cells in a unitary cell group, the dots between the first two cells 50 indicate the presence of one or more other cells 50 between those two cells 50.

Each memory cell 50 is implemented with a variable-threshold FET preferably consisting of a split-gate floating-gate device. The split-gate FET of each cell 50 has a pair of source/drain regions S and D separated by the cell's channel region, a floating-gate FG overlying the channel region near source/drain region S, a control gate CG overlying floating gate FG, and a select gate SG overlying the channel region near source/drain region D. One of cells 50 is so labeled in FIG. 2.

The channel region of each split-gate FET is part of a body region of a suitably doped semiconductor body that includes source/drain regions S and D. The body region forms a pn junction with each of regions S and D. Gates FG, CG, and SG are electrically insulated from each other and from the semiconductor body. Source/drain regions S and D typically respectively function primarily as the source and drain and, for convenience, are hereafter referred to simply as source S and drain D. Although not indicated in FIG. 2, floating gate FG extends partially over source S while select gate SG extends partially over drain D.

In addition to memory cells 50, the EPROM of FIG. 2 contains input/output circuitry/pins 52, a write buffer 54, a column decoder 56, a write-data calculating circuit 58, an adjusting/voltage-enhancing circuit 60, a source-line high-voltage selector 62, a source-line decoder 64, a control-line decoder 66, a high-voltage generator 68 for decoder 66, a low-voltage generator 70 for decoder 66, a select-line decoder 72, a body-line decoder 74, a high-voltage generator 76 for decoder 74, a group of sense amplifiers 78, and a read buffer 80. Components 52, 54, 56, 58, 60, 62, 64, 66, 68, 70, 72, 74, 76, 78, and 80 are collectively connected between a source of a low supply voltage $V_{SS}$ and a source of a high supply voltage $V_{DD}$ whose difference defines a supply voltage range $V_{DD}$–$V_{SS}$. High supply voltage $V_{DD}$ is typically 3 V. Low supply voltage $V_{SS}$ is typically 0 V (ground reference).

Components 52, 54, 56, 58, 60, 62, 64, 66, 68, and 72 constitute circuitry for programming memory cells 50 and thus for writing data into cells 50. The writing circuitry may be considered to include body-line decoder 74 since, as discussed below, it provides a low voltage used by cells 50 during programming. Inasmuch as cells 50 are n-channel FETs, programming entails raising certain portions of cells 50 to programming voltages greater than high supply voltage $V_{DD}$. These cell portions can be control gates CG and sources S as described below. The cell portions raised to the programming voltages can alternatively be control gates CG and drains D by appropriately modifying the programming connections. The principles of the invention apply to the situation in which programming voltages are applied to gates CO and drains D.

Components 66, 70, 72, 74, and 76 constitute circuitry for erasing memory cells 50. All of cells 50 in the EPROM of FIG. 2 are normally erased simultaneously to logic "1" so that their threshold voltages are at low values. Cells 50 may form one of a group of EPROM sections, often termed sectors or banks, arranged in rows and columns of a larger flash EPROM in which the memory cells in each EPROM section are erased simultaneously but can be erased separately, and thus at different times, from the memory cells in each other EPROM section.

After data has been written into a unitary cell group, an erase operation is performed on cells 50 before data is again written into that unitary cell group. Hence, all the bits in each cell group are at logic "1" before any of the bits in that cell group are programmed to logic "0". An erase operation could be considered part of a write operation. However, as used here for flash EPROMs, a write operation means only a programming operation.

Components 52, 56, 66, 72, 78, and 80 constitute circuitry for reading data out of memory cells 50. Decoders 64 and 74 may be considered part of the reading circuitry since they provide low voltages utilized by cells 50 during a read operation. The writing, erasing, and reading circuitries partially overlap since decoders 66 and 72 are parts of each of these three circuitries.

After all of memory cells 50 have been simultaneously erased to logic "1", a write operation is performed by providing input/output circuitry/pins 52 with a unitary bit group to be written into selected cells 50 that form a unitary cell group. Each unitary bit group consists of n bits where n is a fixed integer such as 16 for words or 8 for bytes. Because integer n is fixed, each unitary bit group is of the same bit size as each other unitary bit group in any particular embodiment of the EPROM of FIG. 2. Input/output circuitry/pins 52 provides each unitary bit group as n incoming bit signals A0, A1, . . . An–1 on n lines 82 to write buffer 54 where the unitary bit group is temporarily stored.

Responsive to a write selection signal $V_{WRS}$, write buffer 54 transfers each temporarily stored unitary bit group on n lines 84 as n bit signals B0, B1, . . . Bn–1 (collectively "bit-group signal B") to write-data calculating circuit 58. Write buffer 54 also transfers each temporarily stored unitary bit group on n lines 86 to column decoder 56.

Write-data calculating circuit 58 contains logic that performs a calculation on the logic states of the bits in bit-group signal B to generate a calculation signal consisting of m calculation component signals $V_{C0}, V_{C1}, \ldots V_{Cm-1}$ where m is plural integer. Each of the bits in the unitary bit group can, as indicated above, be logic "0" or logic "1". The lowest possible number of "0s" in the unitary bit group is zero. The highest possible number of "0s" in the unitary bit group is n, the number of bits in the unitary bit group. The number of "0s" in the unitary bit group, and thus the number of "0s" in bit-group signal B, is thus one of the n+1 integers running from 0 n.

The n+1 integers 0, 1, . . . n are allocated into a plurality of integer sets, each containing at least one of the n+1 integers. Each integer is normally present in one, and only one, of the integer sets. That is, none of the integers normally appears in more than one of the integer sets. The number of integer sets normally ranges from two to n+1.

The integers in any integer set containing two or more integers are consecutive integers. For instance, if n is 16, there could be six integer sets: (a) 0, (b) 1, 2, and 3, (c) 4, 5, and 6, (d) 7, 8, and 9, (e) 10, 11, and 12, and (f) 13, 14, 15, and 16. In some embodiments, every integer set contains at least two (consecutive) integers.

Calculating circuit 58 performs comparison operations on the bits of the bit-group signal B to determine the particular integer set that contains an integer equal to the number of those bits that are at logic "0" and thus are to be programmed as "0" into memory cells 20 of the corresponding unitary cell group. Letting "$V_C$" represent the calculation signal formed by calculation component signals $V_{C0}$–$V_{Cm-1}$, circuit 58 then provides calculation signal $V_C$ at a value indicative of that determination. In generating signal $V_C$, circuit 58 may determine the specific number of bits at "0" in bit-group signal B. However, this is not necessary, especially if each integer set contains two or more (consecutive) integers. When each integer set contains two or more integers, circuit 58 can simply determine the appropriate integer set without specifically determining which of its member integers is the number of bits at "0" in signal B.

There exists a plurality of integer sets dealing with the number of bits at logic "1" in bit-group signal B. These integer sets are complementary to the above-described integer sets dealing with the number of logic "0s" in signal B. Calculation circuit 58 may actually utilize the integer set relating to the number of "1s" in signal B. Doing so yields the same calculation achieved with the integer set relating to number of "0s" in signal B because the number of "0s" in signal B equals n minus the number of "1s" in signal B.

Calculating signal $V_C$ is furnished on m lines 86 as m component signals $V_{C0}$–$V_{Cm-1}$ to adjusting/voltage-enhancing circuit 60, generally referred to simply as adjusting circuit 60 below. Adjusting circuit 60 has a writing supply terminal $T_{WR}$ at which an adjusted programming signal $V_{PAS}$ is provided at a voltage greater than high supply voltage $V_{DD}$. In response to calculation signal $V_C$, circuit 60 adjusts how much programming current or/and voltage is provided by signal $V_{PAS}$ at terminal $T_{WR}$ as a function of how many bits in bit-group signal B are at logic "0" and thus as a function of how many memory cells 50 in the associated unitary cell group are to be programmed to "0". Subject to the stepping effects that result from any of the above integer sets containing two or more integers, adjusted programming signal $V_{PAS}$ normally increases in programming current or/and in programming voltage as the number of "0" bits in signal B increases because cells 50 are implemented with n-channel devices.

Adjusting circuit 60 includes high-voltage generation circuitry for providing adjusted programming signal $V_{PAS}$ at a suitable value above $V_{DD}$. The high-voltage generation circuitry typically employs a charge-pumping technique. Examples of the circuitry that implements circuit 60 to provide both the voltage enhancement and the current or/and voltage adjustment are presented below in connection with FIGS. 3 and 4.

Writing supply terminal $T_{WR}$ is connected to a writing supply line 88 on which adjusted programming signal $V_{PAS}$ is supplied to source-line high-voltage selector 62. Responsive to a source-line high-voltage selection signal $V_{SHS}$, selector 62 provides a selected one of programming signal $V_{PAS}$ and high supply voltage $V_{DD}$ on a selector line 90 as a source-line high-voltage signal $V_{PHS}$. Programming signal $V_{PAS}$ is supplied on line 90 when selection signal $V_{SHS}$ is at a program-enabling value (e.g., $V_{DD}$) to select programming/write. Consequently, line 90 is selectively connectable to terminal $T_{WR}$ for receiving signal $V_{PAS}$ during a write operation. Supply voltage $V_{DD}$ is provided on line 90 at other times, e.g., during erase and read operations, by setting selection signal $V_{SHS}$ at a program-disabling value (e.g., $V_{SS}$).

High-voltage signal $V_{PHS}$ is supplied on line 90 to source-line decoder 64 as its high supply voltage. Decoder 64 receives a source-line selection (or selection/control) signal $V_{SLS}$ and a group of row address signals $V_{RAD}$. For a programming/write operation, selection signal $V_{SLS}$ is at a program-enabling value. Signal $V_{SLS}$ is also at the program-enabling value for a read operation. Signal $V_{SLS}$ is at a program-disabling (or erasure-selection) value for an erase operation.

Responsive to selection signal $V_{SLS}$ and row address signals $V_{RAD}$ and using high-voltage signal $V_{PHS}$ as the high supply voltage, source-line decoder 64 provides a group of source-line writing signals $V_{SL}$ respectively on source-line writing electrical conductors 92, each connected to sources S of memory cells 50 in one or more of the rows of cells 50. In a preferred embodiment, each source-line writing conductor 92 is connected to sources S of cells 50 in four cell rows for providing an associated one of writing signals $V_{SL}$ to those sources S. When selection signals $V_{SHS}$ and $V_{SLS}$ are both placed at their respective program-enabling values, each writing conductor 92 is selectively connectable through decoder 64, line 90, high-voltage selector 62, and line 88 to writing supply terminal $T_{WR}$ of adjusting circuit 60. Sources S of cells 50 in each cell row are thereby selectively connectable through that row's writing conductor 92 and the other intervening circuitry to terminal $T_{WR}$.

More particularly, row address signals $V_{RAD}$ respectively correspond to the rows of memory cells 50. Each address signal $V_{RAD}$ has a low voltage level equal to $V_{SS}$ and a high voltage level equal to $V_{DD}$. Setting one of signals $V_{RAD}$ at $V_{SS}$ selects the corresponding row of cells 50. When selection signal $V_{SLS}$ is at its program-enabling value, source-line decoder 64 connects line 90 to the sources of cells 50 in that row by way of that row's writing conductor 92. With selection signal $V_{SHS}$ simultaneously set at its program-enabling value, high-voltage selector 62 connects line 90 to writing supply terminal $T_{WR}$ as described above. Hence, the sources of cells 50 in a selected cell row are connected to terminal $T_{WR}$ during a programming/write operation.

Significant voltage losses typically occur in the circuitry, especially source-line decoder 64, by which each source-line writing conductor 92 is selectively connected to writing supply terminal $T_{WR}$. During a programming/write operation, source-line writing signal $V_{SL}$ on writing conductor 92 connected to sources S of memory cells 50 in a selected cell row is provided to those sources S at a source programming voltage $V_{PPS}$ substantially greater than $V_{DD}$ but somewhat less than the $V_{PAS}$ programming voltage at terminal $T_{WR}$. Source programming voltage $V_{PPS}$, typically 6 V above $V_{SS}$, is typically normally 1–2 V below the $V_{PAS}$ voltage at terminal $T_{WR}$. As described further below, the presence of programming voltage $V_{PPS}$ on writing conductor 92 for a selected row of cells 50 subjects a selected unitary group of cells 50 in the selected row to programming. Adjusting circuit 60 operates in response to calculation signal $V_C$ provided from write-data calculating circuit 58 to adjust programming signal $V_{PAS}$ at terminal $T_{WR}$ so that source programming voltage $V_{PPS}$ is approximately the same regardless of how many cells 50 in that unitary cell group are to be programmed to logic "0".

Row address signals $V_{RAD}$ are normally generated in such a manner that only one row of memory cells 50 is selected for a programming/write operation at a time. As indicated above, each source-line writing conductor 92 is preferably connected to sources S of cells 50 in four cell rows. When one cell row is selected for programming, writing signal $V_{SL}$ on that row's writing conductor 92 is also supplied at $V_{PPS}$ to sources S of cells 50 in the other three rows. However, due to signals provided by other portions of the EPROM in FIG. 2, none of cells 50 in those other three rows undergoes programming. Signals $V_{SL}$ on all other conductors 92 are at $V_{SS}$.

For a read operation, placing selection signal $V_{SHS}$ to source-line decoder 64 at the $V_{SHS}$ program-disabling value in combination with placing selection signal $V_{SLS}$ to high-voltage selector 62 at the $V_{SLS}$ program-enabling value causes writing signals $V_{SL}$ to be at $V_{SS}$ on all of writing conductors 92. For an erase operation, placing both of signals $V_{SHS}$ and $V_{SLS}$ at their respective program-disabling (or erasure-selection) values effectively electrically disconnects all of conductors 92 from decoder 64. Consequently, signals $V_{SL}$ on conductors 92 float during erasure.

Control-line decoder 66 is connected to high-voltage generator 68 by way of a line 94 for receiving a high control programming voltage $V_{PHC}$ substantially greater than $V_{DD}$. Control programming voltage $V_{PHC}$, typically 10 V above $V_{SS}$, is also greater than source programming voltage $V_{PPS}$. Low-voltage generator 70 provides a line 96 to decoder 66 with a low control erasure voltage $V_{ELC}$ substantially less than $V_{SS}$. Erasure voltage $V_{ELC}$ is typically 10 V below $V_{SS}$. Decoder 66 also receives row address signals $V_{RAD}$ and a group of control-line selection (or selection/control) signals $V_{CLS}$. There are typically two selection signals $V^{CLS}$, one of which is the same as selection signal $V_{SLS}$ to source-line decoder 64. Programming/write, erase, and read are variously selected by generating selection signals $V_{CLS}$ at suitable values.

Responsive to row address signals $V_{RAD}$ and selection signals $V_{CLS}$, control-line decoder 66 provides a group of control-line writing signals $V_{CL}$ on control-line writing conductors 98, each connected to control gates CG of memory cells 50 in one or more rows of cells 50. In the preferred embodiment where each source-line writing conductor 92 is connected to sources S of cells 50 in four cell rows, each control-line writing conductor 98 is connected to control gates CG of cells 50 in four rows for providing those control gates CG with an associated one of writing signals $V_{CL}$. Each of the four cell rows connected to a particular control-line writing conductor 98 is connected to a different source-line writing conductor 92 than each other of those four cell rows.

Control-line decoder 66 variously provides each control-line writing signal $V_{CL}$ at one of the following four voltages (running from the highest to the lowest): $V_{PHC}$, $V_{DD}$, $V_{SS}$, and $V_{ELC}$. Writing signals $V_{CL}$ are provided only at $V_{PHC}$ and $V_{SS}$ during programming/write. A memory cell 50 can undergo programming when its control gate CG receives control programming voltage $V_{PHC}$ from decoder 66 and its source S receives slightly lower source programming voltage $V_{PPS}$ from source-line decoder 64. A cell 50 does not undergo programming when its control gate CG receives control programming voltage $V_{PHC}$ but its source S receives supply voltage $V_{SS}$ from decoder 64. Likewise, a cell 50 does not undergo programming when its source S receives source programming voltage $V_{PPS}$ but its control gate CG receives voltage $V_{SS}$ from decoder 66.

When selection signals $V_{CLS}$ are furnished to control-line decoder 66 at values that select programming/write and one of row address signals $V_{RAD}$ is set at $V_{SS}$ to select a row of memory cells 50, a control-line writing line signal $V_{CL}$ at high programming voltage $V_{PHC}$ is provided from decoder 66 on control-line writing conductor 98 for that cell row and also for three other cell rows. Signals $V_{CL}$ are at $V_{SS}$ on all other writing conductors 98. At the same time, selection signals $V_{SHS}$ and $V_{SLS}$ to source-line decoder 64 and high-voltage selector 62 are set at their respective program-enabling values for causing a source-line writing signal $V_{SL}$ at programming voltage $V_{PPS}$ to be provided from decoder 64 on source-line writing conductor 92 for the selected cell row and three other cell rows. Even though, (a) four cell rows, including the selected cell row, simultaneously receive control programming voltage $V_{PHC}$ and (b) four cell rows, again including the selected cell row, receive source programming voltage $V_{PPS}$, only the selected cell row receives both of programming voltages $V_{PHC}$ and $V_{PPS}$ due to the above-mentioned manner in which writing conductors 92 and 98 are connected to cells 50. As a result, only cells 50 in a selected cell row can undergo programming/write.

For a read operation, setting selection signals $V_{CLS}$ to control-line decoder 66 at the requisite values for selecting read in combination with setting one of row address signals $V_{RAD}$ at $V_{SS}$ to select the corresponding row causes control-line writing signal $V_{CL}$ on control-line writing conductor 98 for the selected row to be at $V_{DD}$. Writing signals $V_{CL}$ on all other writing conductors 98 are at $V_{SS}$ during the read operation. For an erase operation, setting signals $V_{CLS}$ at their erasure-selection values causes signals $V_{CL}$ to be at low erasure voltage $V_{ELC}$ on all lines 98. This enables all of memory cells 50 to be erased simultaneously. When cells 50 constitute one of a group of EPROM sections for which the memory cells in each EPROM section are erasable simultaneously but separately from the memory cells in each other EPROM section, signals $V_{CL}$ are provided at $V_{SS}$ on all lines 98 in each EPROM section not being erased at the same time as cells 50 in the illustrated section.

Select-line decoder 72 receives row address signals $V_{RAD}$ and one or more select-line selection (or selection/control) signals $V_{SGS}$ (hereafter referred to, for convenience, in the plural even though there may be only one selection signal $V_{SGS}$). Programming/write, erase, and read are selected by providing selection signals $V_{SGS}$ at suitable values. Responsive to address signals $V_{RAD}$ and selection signals $V_{SGS}$, decoder 72 provides a group of row-selection signals $V_{SG}$ on word lines 100 respectively corresponding to the rows of memory cells 50. Each word line 100 is connected to select gates SG of cells 50 in a different cell row. When selection signals $V_{SGS}$ are at values that select programming/write, row-selection signal $V_{SG}$ on a word line 100 for a selected row of cells 50 is at an intermediate voltage $V_{ITM}$ between $V_{SS}$ and $V_{DD}$ but closer to $V_{DD}$. Intermediate voltage $V_{ITM}$ is typically 2 V above $V_{SS}$ and thus typically 1 V below $V_{DD}$. Row-selection signals $V_{SG}$ on all other word lines 100 are at $V_{SS}$.

For a read operation, setting selection signals $V_{SGS}$ to select-line decoder 72 at values that select read causes row-selection signals $V_{SG}$ to be at $V_{DD}$ on word line 100 for a selected row of memory cells 50. Row-selection signals $V_{SG}$ are at $V_{SS}$ on all other word lines 100 during the read operation. For an erase operation, setting selection signals $V_{SGS}$ at values that select erasure causes row-selection signals $V_{SG}$ to be at $V_{ITM}$, again typically 2 V above $V_{SS}$ and thus typically 1 V below $V_{DD}$, on all word lines 100. Signals $V_{SG}$ on word lines 100 are at $V_{SS}$ in an EPROM section not being erased at the same time as the illustrated section.

Decoders 64, 66, and 72 have been described here, and illustrated in FIG. 2, as separate decoders. However, source-line decoder 64 and control-line decoder 66 operate in synchronism. As mentioned above, selection signal $V_{SLS}$ provided to decoder 64 is typically one of selection signals $V_{CLS}$ provided to decoder 66. Part of the circuitry that processes row address signals $V_{RAD}$ and selection signal $V_{SLS}$ in decoder 64 can be the same as part of the circuitry that processes address signals $V_{RAD}$ and selection signals $V_{CLS}$ in decoder 64. In some embodiments, part of the high-voltage generation circuitry in adjusting circuit 60 can be the same as part of the circuitry that forms high-voltage generator 68.

Also, part of the circuitry that processes row address signals $V_{RAD}$ in select-line decoder 72 can be the same as parts of the circuitries that process signals $V_{RAD}$ in decoders 64 and 66. Accordingly, the total amount of circuitry needed for decoders 64, 66, and 72 can be reduced by merging them together to form a composite row decoder. In some embodiments high-voltage generator 68 and the high-voltage generation circuitry in adjusting circuit 60 can likewise be merged together. Components 60, 62, 68, and 70 can then form part of the composite row decoder.

Body-line decoder 74 is connected to high-voltage generator 76 by way of a line 102 to receive a high body erasure voltage $V_{EHB}$ substantially greater than $V_{DD}$. Body erasure voltage $V_{EHB}$ is typically 8 V above $V_{SS}$. Responsive to a body-line selection (or selection/control) signal $V_{BLS}$, decoder 74 provides a body-line signal $V_{BL}$ on a body line 104 to the body regions (including the channel regions) of all memory cells 50. Selection signal $V_{BLS}$ is provided at one value to select a programming/write or read operation, and at another value to select an erase operation. When selection signal $V_{BLS}$ is at the value for selecting programming/write or read, body-line signal $V_{BL}$ is at $V_{SS}$.

Body-line signal $V_{BL}$ is at high erasure voltage $V_{EHB}$ when selection signal $V_{BLS}$ is at the erasure-selection value. When selection signals $V_{SLS}$, $V_{CLS}$, and $V_{SGS}$ to decoders 64, 66, and 72 are also at their erasure-selection values, all of cells 50 in the EPROM of FIG. 2 are erased simultaneously to logic "1". In the case where illustrated cells 50 form a simultaneously erasable section of a larger EPROM containing one or more other simultaneously erasable sections that are separately erasable from the illustrated section, body-line signal $V_{BL}$ is provided at $V_{SS}$ on a body line to the body regions of all memory cells in each EPROM section not being erased at the same time as the illustrated section.

Part of the circuitry that forms high-voltage generator 76 can be the same as part of the circuitry that forms high-voltage generator 68 and, in some embodiments, the same as part of the high-voltage generation circuitry in adjusting circuit 60. High-voltage generator 76 can thus be merged with high-voltage generator 68 and, in some embodiments, also with adjusting circuit 60. Accordingly, body-line decoder 74 and generator 76 can be merged together into the above-mentioned composite row decoder that includes component 60, 62, 64, 66, 68, 70, and 72.

Column decoder 56 receives a group of column address signals $V_{CAD}$ and, as mentioned above, bit-group signal B on lines 86 from write buffer 54 during a programming/write operation. Drains D of memory cells 50 in each column are connected to decoder 56 by way of one of bit lines 106 that carries one of bit line signals $V_D$. When write selection signal $V_{WRS}$ is at a value that selects a programming/write operation, n bits of a unitary bit group temporarily stored in write buffer 54 are transferred on lines 86 as signal B to column decoder 56. Responsive to column address signals $V_{CAD}$, decoder 56 provides the unitary bit group on n selected ones of bit lines 106. Bit line signal $V_D$ on each of these n selected bit lines 106 is $V_{SS}$ for a bit at logic "0" and $V_{DD}$ for a bit at logic "1". Decoder 56 provides bit line signals $V_D$ at $V_{DD}$ on all other bit lines 106.

The combination of address signals $V_{RAD}$ and $V_{CAD}$ and selection signals $V_{SLS}$, $V_{CLS}$, and $V_{SGS}$ causes n memory cells 50 along one cell row to be selected for a programming/write operation. Each selected cell 50 whose drain D is connected to a bit line 106 carrying bit line signal $V_D$ at $V_{SS}$ receives low supply voltage $V_{SS}$ (again typically 0 V) at that cell's drain D, source programming voltage $V_{PPS}$ (again typically 6 V above $V_{SS}$) at that cell's source S, control programming voltage $V_{PHC}$ (again typically 10 V above $V_{SS}$) at that cell's control gate CG, and intermediate voltage $V_{ITM}$ (again typically 2 V above $V_{SS}$) at that cell's select gate SG. These voltage conditions create a high-energy (hot) electron flow from drain D of that cell 50 to its source S. Due to the high value of programming voltage $V_{PHC}$ at that cell's control gate CG, some of the high-energy electrons enter floating gate FG of that cell 50 near its source S to raise that cell's threshold voltage from the erasure value to a high programming value so as to program logic "0" into that cell 50.

Each selected memory cell 50 whose drain D is connected to a bit line 106 carrying a bit line signal $V_D$ at $V_{DD}$ receives high supply voltage $V_{DD}$ (typically 3 V above $V_{SS}$) at that cell's drain D, source programming voltage $V_{PPS}$ at that cell's source S, control programming voltage $V_{PHC}$ at that cell's control gate CG, and intermediate voltage $V_{ITM}$ at that cell's select gate SG. Because voltages $V_{PPS}$ and $V_{DD}$ at that cell's source S and drain D both exceed voltage $V_{ITM}$ at that cell's select gate SG, the portion of that cell 50 below gate SG remains off. Accordingly, each cell 50 which receives voltage $V_{DD}$ at its drain D remains off. Threshold voltage for that cell 50 remains at the low erasure value, and that cell 50 remains at logic "1".

Compensation for current flowing through memory cells 50 that do not undergo programming to logic "0" when one or more other cells undergo programming to "0" is achieved by adjusting how programming signal $V_{PAS}$ at writing supply terminal $T_{WR}$ varies with the number of "0s" in bit signal B and thus with the number of cells 50 to be programmed to "0". This applies to cells 50 located in a cell row selected for programming/write and to cells 50 in other rows such as the other three cell rows that receive source programming voltage $V_{PPS}$ at the same time as the selected cell row and the other three cell rows that receive control programming voltage $V_{PHC}$ at the same time as the selected cell row.

Column decoder 56 is connected by way of lines 108 to sense amplifiers 78 which are connected by way of lines 110 to read buffer 80. The number of amplifiers 78, and also the number of lines 110, is normally n. Read buffer 80 is connected by way of n lines 112 to input/output circuitry/pins 52. The EPROM of FIG. 2 includes precharge circuitry (not shown) for charging bit lines 106 to a suitable precharge voltage before reading data out of memory cells 50. Responsive to a read selection signal $V_{RDS}$, amplifiers 78 and buffer 80 are activated to read the data stored in selected unitary bit groups of cells 50 as determined by address signals $V_{RAD}$ and $V_{CAD}$ supplied to decoders 72 and 56 and to transfer that data through circuitry/pins 52 outside the EPROM.

As mentioned above, memory cells 50 in the EPROM of FIG. 2 may be a simultaneously erasable section of a larger EPROM that contains other such EPROM sections, each of which can be erased separately from each other EPROM section. Components 52, 54, 56, 58, 60, 62, 64, 66, 68, 70, 72, 74, 76, 78, and 80 can be connected to all of these EPROM sections. In that case, source-line writing conductors 92, control-line writing conductors 98, and bit lines 106 may be local to each such EPROM section. Column decoder 56 may contain global bit lines that traverse the columns of EPROM sections and are suitably selectively connected to these local bit lines 106 as described in Kim, co-filed U.S. patent application Ser. No. 10/640,929. Source-line decoder 64 and control-line decoder 66 may similarly include global lines that traverse rows of each EPROM section and are suitably selectively connected to local writing conductors 92 and 98.

Figure 3:
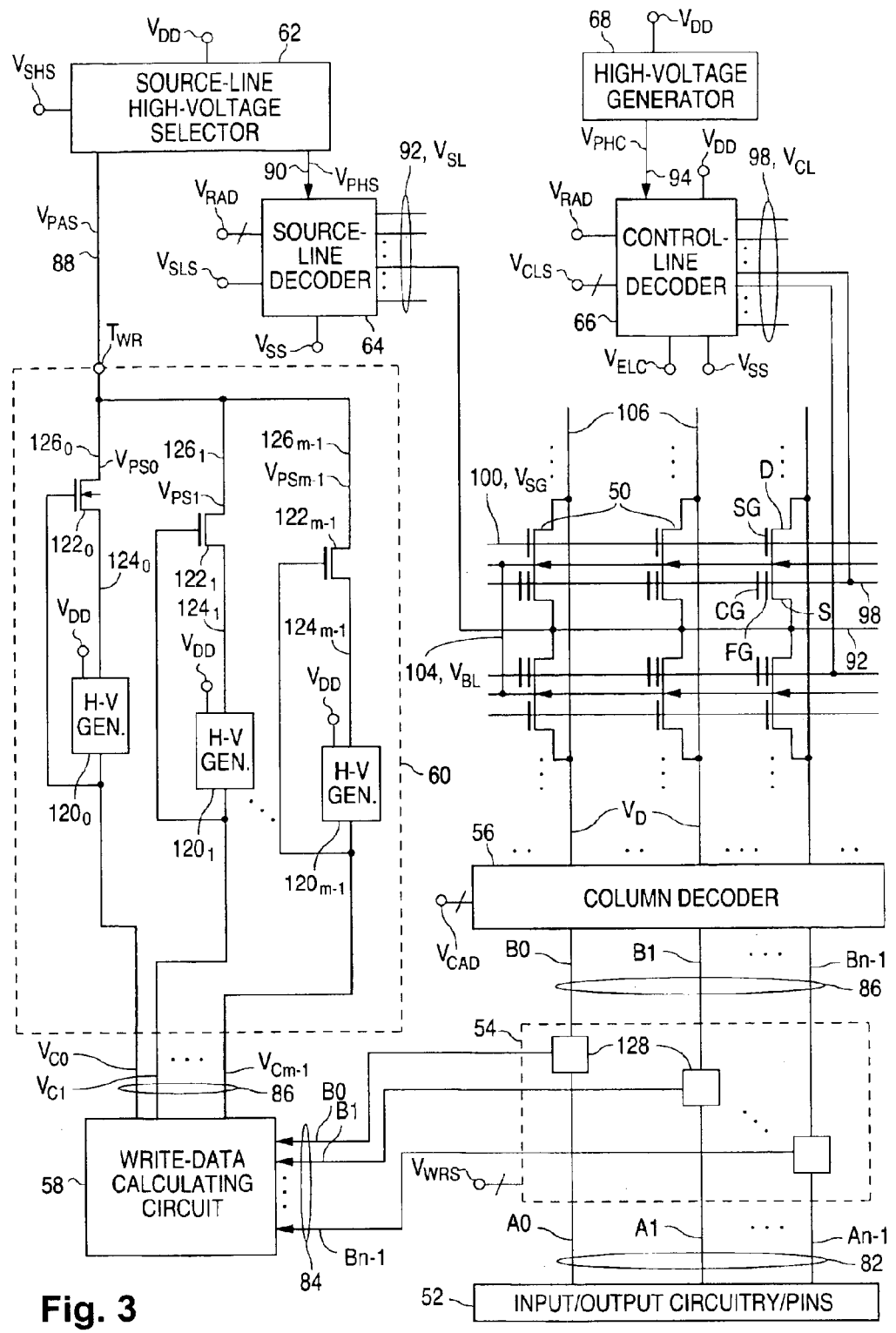
FIG. 3 is a block/circuit diagram of a current-adjusting implementation of the writing circuitry in the EPROM of FIG. 2.

FIG. 3 depicts an implementation of the writing circuitry in the EPROM of FIG. 2 for which adjusting circuit 60 utilizes a current-adjusting technique. Circuit 60 in the implementation of FIG. 3 consists of m current-supply components where fixed integer m ranges from 2 to n here. Letting i be an integer that runs from 0 to m-1, each current-supply component contains a high-voltage generator $120_i$ and an FET $122_i$. High-voltage generator $120_i$ in each current-supply component $120_i/122_i$ receives a calculation component signal $V_{Ci}$ from write-data calculating circuit 58 on a corresponding different one of lines 86. Each component signal $V_{Ci}$ is also provided on its line 86 to the gate electrode of FET $122_i$. Alternatively, each component signal $V_{Ci}$ may be provided to a level shifter (not shown) whose level-shifted output signal is provided to the gate electrode of FET $122_i$.

Each high-voltage generator $120_i$ is connected by way of a generator supply line $124_i$ to the source of FET $122_i$ whose drain is connected to a supply conductor $126_i$. Each supply conductor $126_i$ provides a supply programming voltage $V_{PSi}$ at a current $I_{PSi}$. Supply conductors $126_0$–$126_{m-1}$ are connected together and to writing supply terminal $T_{WR}$. Supply programming currents $I_{PS0}$–$I_{PSm-1}$ are thereby summed at terminal $T_{WR}$ to produce the $V_{PAS}$ programming current.

When a calculation component signal $V_{Ci}$ is at a high voltage corresponding to a logic "1", high-voltage generator $120_i$ is activated and FET $122_i$ is likewise turned on due either to the high voltage of signal $V_{Ci}$ itself or, if the indicated level shifter (again, not shown) is present, the corresponding level-shifted high voltage generated from signal $V_{Ci}$. Using voltage $V_{DD}$ as the high supply voltage, generator $120_i$ provides current on supply line $124_i$ at a voltage greater than $V_{DD}$. This current flows through FET $122_i$ to produce supply programming signal $V_{PSi}$ at a voltage largely equal to $V_{PAS}$ and at a non-zero value of supply current $I^{PSi}$. In the situation where all of component signals $V_{C0}$–$V_{Cm-1}$ are at logic "1", all of currents $I_{PS0}$–$I_{PSm-1}$ can be largely equal. Alternatively, currents $I_{PS0}$–$I_{PSm-1}$ can differ significantly. For example, each current $I_{PSi+1}$ can be twice current $I_{PSi}$, and vice versa. When a component signal $V_{Ci}$ is at a low voltage corresponding to a logic "0", FET $122_i$ is turned off. Current $I_{PSi}$ is then zero.

Each calculation component signal $V_{Ci}$ is variously at logic "0" or logic "1" depending on the number of bits at "0" (or "1") in bit-group signal B. Since supply programming currents $I_{PS0}$–$I_{PSm-1}$ are summed at writing supply terminal $T_{WR}$ and since any current $I_{PSi}$ is zero when its component signal $V_{Ci}$ is at "0", the $V_{PAS}$ current is adjusted as a function of how many bits in bit-group signal B are at "0" (or "1"). Subject to the stepping limitations imposed by the integer sets used to produce calculation signal $V_C$ from signal B, the $V_{PAS}$ current progressively increases as the number of bits at "0" in signal B increases. There are at least two non-zero levels of the $V_{PAS}$ current because m, the number of current-supply components $120_0$/$122_0$–$120_{m-}$/$122_{m-}$, is at least two.

Voltage losses occur, as indicated above, in converting programming signal $V_{PAS}$ at writing supply terminal $T_{WR}$ into source-line writing signals $V_{SL}$ supplied on source-line writing conductors 92 as source programming voltage $V_{PPS}$ during a programming/write operation. Similar current losses may also occur. Because the $V_{PAS}$ current is adjusted as a function of how many bits in bit-group signal B are at logic "0", and thus as a function of how many memory cells 50 in the corresponding unitary cell group are to be "0", these voltage/current losses are more uniform as the number of cells 50 to be programmed to "0" varies from zero to n than what would occur in the absence of adjusting the $V_{PAS}$ current according to the invention. Accordingly, source programming voltage $V_{PPS}$ is more uniform as the number of cells 50 being programmed to "0" varies from zero to n. The implementation of FIG. 3 thus alleviates writing inaccuracy due to overprogramming and underprogramming.

The internal configuration of read buffer 54 is schematically illustrated in FIG. 3. Buffer 54 contains n bit buffers 128. Each bit buffer 128 receives one of incoming bit signals A0–An-1 for temporary storage and provides a corresponding one of bit signals B0–Bn-1 on one of lines 84 to write-data calculating circuit 58 and on one of lines 86 to column decoder 56.

Figure 4:
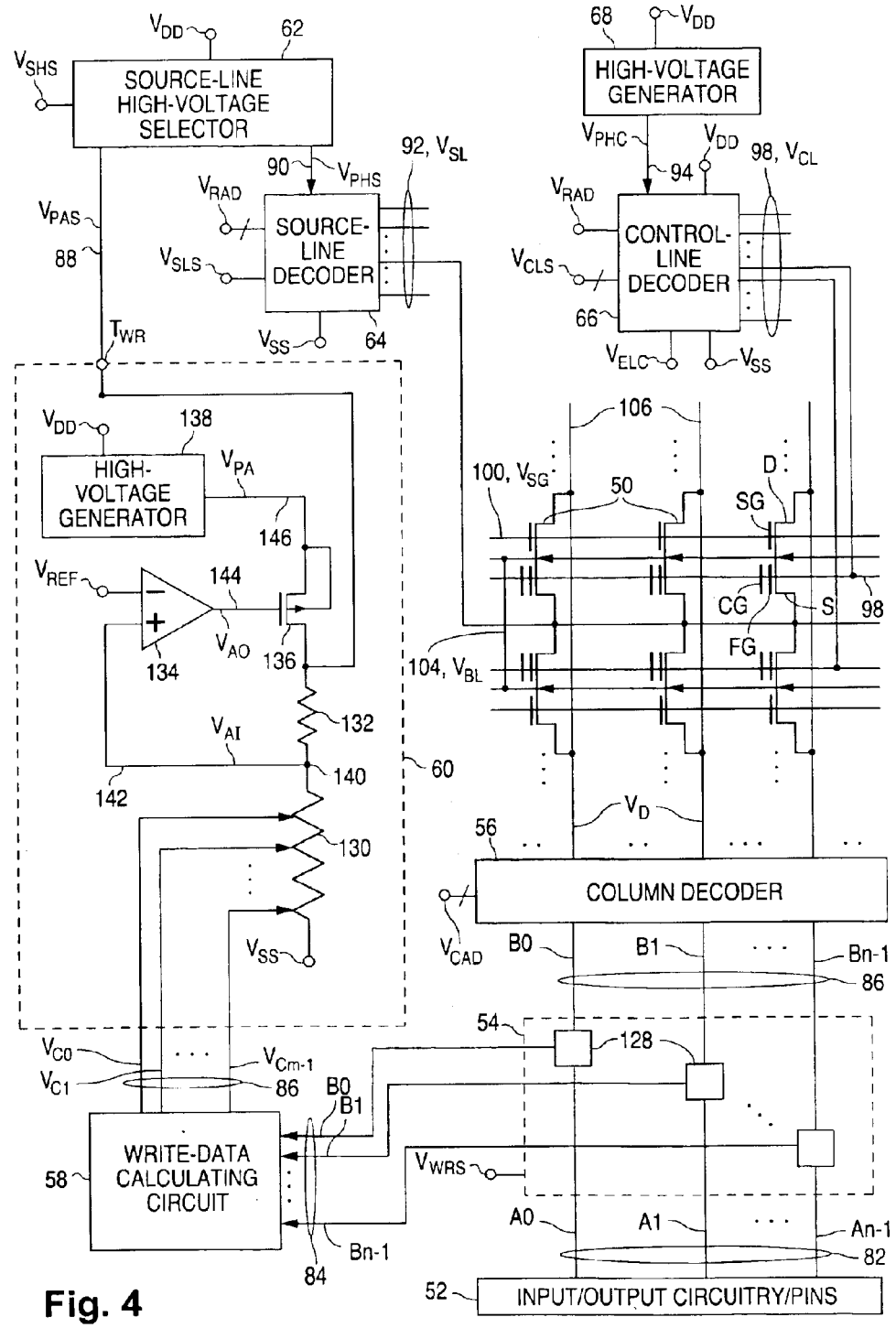
FIG. 4 is a block/circuit diagram of a voltage-regulating implementation of the writing circuitry in the EPROM of FIG. 2.

FIG. 4 illustrates an implementation of the writing circuit in the EPROM of FIG. 2 in which adjusting circuit 60 utilizes a voltage-regulation technique. Circuit 60 in the implementation of FIG. 4 contains a variable resistor 130, a fixed resistor 132, an operational amplifier 134, a high-voltage p-channel insulated-gate FET 136, and a high-voltage generator 138.

Variable resistor 130 is connected between the $V_{SS}$ supply and a node 140. Components $V_{C0}$–$V_{cm-1}$ of calculation signal $V_C$ are provided to resistor 130 for causing its resistance $R_V$ to vary from a low value $R_{VL}$ to a high value $R_{VH}$. Variable resistance $R_V$ is at high value $R_{VH}$ when the number of bits at logic "0" in bit-group signal B is zero. Resistance $R_V$ is at low value $R_{VL}$ when the number of bits at "0" in signal B is n, the number of bits in signal B. Subject to the stepping limitations of the integer sets by which signal B is converted into calculation signal $V_C$, resistance $R_V$ generally decreases as the number of bits at "0" in signal B increases.

Fixed resistor 132 is connected between node 140 and writing supply terminal $T_{WR}$. The non-inverting (+) input terminal of operational amplifier 134 receives an amplifier input voltage $V_{A1}$ on a line 142 connected to node 140. The inverting (−) input terminal of amplifier 134 receives a reference voltage $V_{REF}$, typically 1.2 V above $V_{SS}$. Amplifier 134 supplies its amplified output voltage $V_{AO}$ on a line 144 connected to the gate electrode of FET 136 whose drain is connected to terminal $T_{WA}$. High-voltage generator 138 provides a high voltage $V_{PA}$ on a line 146 connected to the interconnected source and body region of FET 136.

Adjusting circuit 60 in the implementation of FIG. 4 operates as follows. Using high-supply voltage $V_{DD}$, high-voltage generator 138 generates high voltage $V_{PA}$ at a largely constant value greater than source programming voltage $V_{PPS}$ and thus substantially greater than $V_{DD}$. Voltage $V_{PA}$ is typically 7.5 V above $V_{SS}$. Generator 138 typically utilizes a charge-pumping technique to produce voltage $V_{PA}$ in this manner.

Operational amplifier 134 has a high gain. The high gain forces amplifier input voltage $V_{A1}$ to be very close to reference voltage $V_{REF}$. Variable resistor 130 and fixed resistor 132 form a resistive divider in which input voltage $V_{A1}$ is given approximately as:

$$V_{A1} = \left(\frac{R_V}{R_V + R_F}\right)(V_{PAS} - V_{SS}) \tag{1}$$

where $R_F$ is the resistance of fixed resistor 132. As a result, programming voltage $V_{PAS}$ at writing supply terminal $T_{WR}$ is given approximately as:

$$V_{PAS} = \left(\frac{R_V + R_F}{R_V}\right)(V_{REF} - V_{SS}) \tag{2}$$

since amplifier input voltage $V_{A1}$ approximately equals reference voltage $V_{REF}$. Inspection of Eq. 2 shows that the $V_{PAS}$ programming voltage increases when variable resistance $R_V$ decreases, and vice versa.

Programming voltage $V_{PAS}$ is less than high voltage $V_{PA}$ provided from high-voltage generator 138. Depending on the value of variable resistance $R_V$, the $V_{PAS}$ programming voltage is typically in the range of 6–7 V above $V_{SS}$.

As mentioned above, variable resistance $R_V$ generally decreases as the number of bits at logic "0" in bit-group signal B increases subject to the stepping limitations of the integer sets. Accordingly, the voltage difference across resistors 130 and 132 progressively increases to progressively increase the $V_{PAS}$ programming voltage as the number of bits at "0" in signal B increases subject to the integer-set stepping limitations. More specifically, the voltage difference across resistors 130 and 132 progressively increases to progressively increase the $V_{PAS}$ voltage as the number of bits at "0" in signal B increases in integer increments corresponding to the integer sets. Because m is 2, there are at least three different levels of the $V_{PAS}$ voltage.

As in the implementation of FIG. 3, voltage losses occur in converting programming signal $V_{PAS}$ into source-line signals $V_{SL}$ supplied on source-line writing conductors 92 at source programming voltage $V_{PPS}$ for programming selected cells 50 in the implementation of FIG. 4. The voltage losses generally increase as the number of bits being programmed to logic "0" in cells 50 of a unitary cell group increases. By appropriately choosing the characteristics of resistors 130 and 132, the increase in the $V_{PAS}$ programming voltage approximately matches the corresponding voltage loss as the number of bits being programmed to "0" in a unitary group of cells 50 varies from zero to n. Accordingly, source programming voltage $V_{PPS}$ on each writing conductor 92 is approximately constant regardless of how many bits are programmed to "0" in each unitary cell group along that conductor 92.

Figure 5:
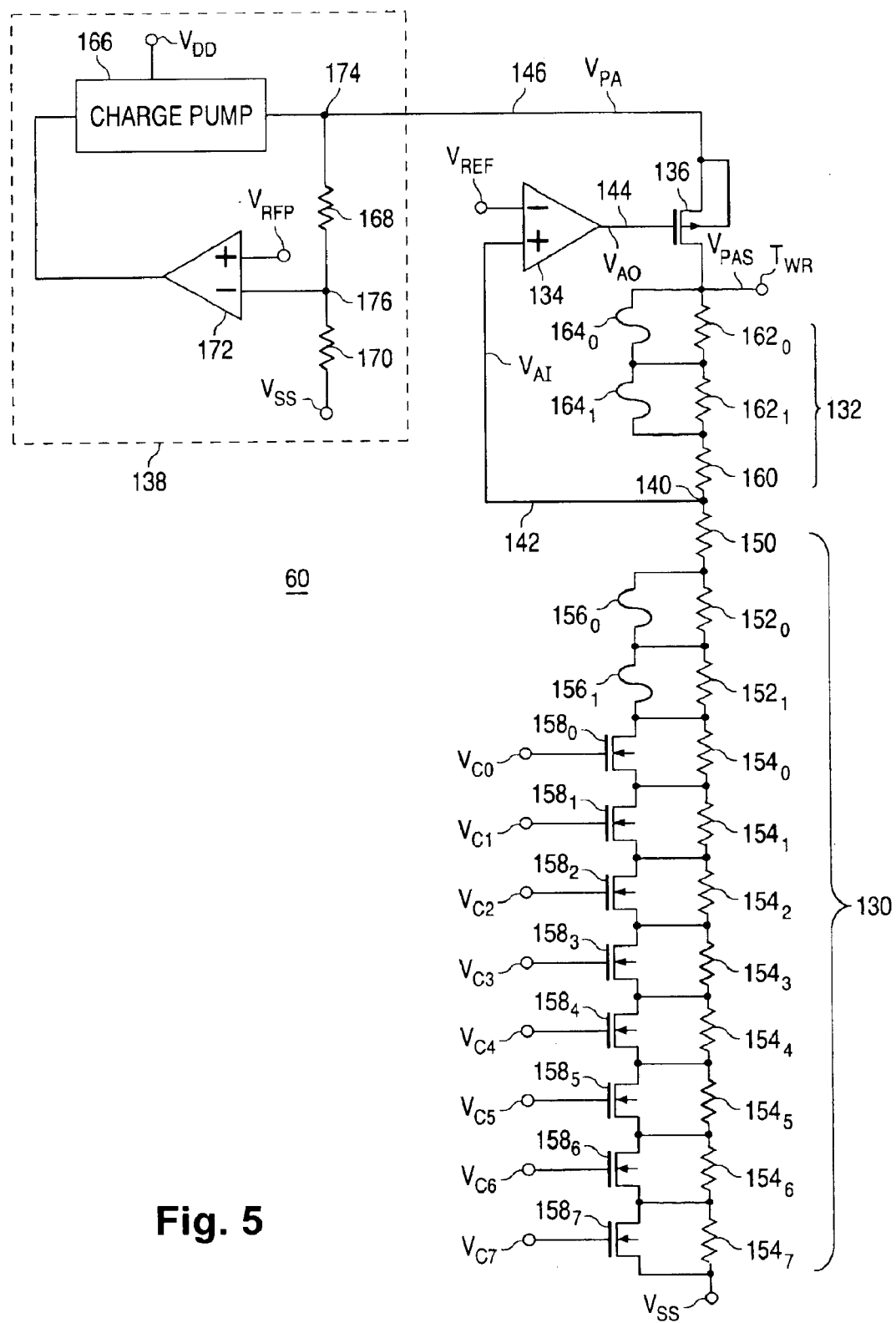
FIG. 5 is a block/circuit diagram of an implementation of the adjusting/voltage-enhancing circuit in the writing circuitry of FIG. 4.

FIG. 5 illustrates an implementation of adjusting circuit 60 in the implementation of FIG. 4 for the situation in which m is 8, i.e., calculation signal $V_C$ has eight components $V_{C0}$–$V_{C7}$. Variable resistor 130 is implemented with eleven resistor segments 150, $152_0$, $152_1$, $154_0$, $154_1$, $154_2$, $154_3$, $154_4$, $154_5$, $154_6$, and $154_7$ connected in series. Fuses $156_0$ and $156_1$ are respectively connected across resistors segments $152_0$ and $152_1$. The resistance of each segment $152_0$ or $152_1$ is made part of variable resistance $R_V$ by open circuiting (blowing) that segment's fuse $156_0$ or $156_1$. If fuses $156_0$ and $156_1$ are left intact, they short circuit segments $152_0$ and $152_1$ so that their resistances are not part of resistance $R_V$.

A switch implemented with an FET $158_i$ is connected across each resistor $154_i$ where integer i runs from 0 to 7 here. A calculation component signal $V_{Ci}$ is provided to the gate electrode of each FET $158_i$. Each FET $158_i$ is turned off when its component signal $V_{Ci}$ is at a low voltage corresponding to logic "0". The resistance of resistor segment $154_i$ is then part of variable resistance $R_V$. When component signal $V_{Ci}$ is at a high value corresponding to logic "1", FET $158_i$ is turned on and short circuits segment FET $154_i$ so that its resistance is not part of resistance $R_V$. Consequently, resistance $R_V$ has a potential resistance range whose low value can be permanently adjusted from the resistance of segment 150 to the sum of the resistances of segments 150, $152_0$, and $152_1$ and whose high value can be correspondingly permanently adjusted from the sum of the resistances of segments 150 and $154_0$–$154_7$ to the sum of the resistances of segments 150, $152_0$, $152_1$, and $154_0$–$154_7$.

Variable resistance $R_V$ varies, as indicated above, across a range extending from low value $R_{VL}$ to high value $R_{VH}$ as the number of bits at logic "0" in bit-group signal B varies from zero to n. In the implementation of FIG. 5, component calculation signals $V_{C0}$–$V_{C7}$ are typically provided at values that result in range $R_{VH}$–$R_{VL}$ being only part of the total potential range across which resistance $R_V$ can be varied. Certain combinations of the values of signals $V_{C0}$–$V_{C7}$ may produce the same $R_V$ values as other combinations of the $V_{C0}$–$V_{C7}$ values. Also, different combinations of the $V_{C0}$–$V_{C7}$ values that result from different ways of achieving the same number of "0s" in signal B may lead to slightly different $R_V$ values.

Fixed resistor 132 is implemented with three resistor segments 160, $162_0$, and $162_1$ connected in series. Fuses $164_0$ and $164_1$ are respectively connected across resistor segments $162_0$ and $162_1$. The resistance of each segment $162_0$ or $162_1$ is made part of the resistance of resistor 132 by open circuiting that segment's fuse $164_0$ or $164_1$. If fuses $164_0$ and $164_1$ are left intact, they short circuit segments $162_0$ and $162_1$ so that their resistances are not part of the resistance of resistor 132. Consequently, the resistance of resistor 132 is permanently adjustable from a low value equal to the resistance of segment 160 to a high value equal to the sum of the resistances of segments 160, $162_0$, and $162_1$.

High-voltage generator 138 is formed with a charge pump 166, resistors 168 and 170, and an operational amplifier 172 in the implementation of FIG. 5. Charge pump 166 generates high voltage $V_{PA}$ and provides voltage $V_{PA}$ through a node 174 to line 146. Resistor 168 is connected between node 174 and a node 176 connected to the inverting input terminal of operational amplifier 172. Resistor 170 is connected between the $V_{SS}$ supply and node 176. An additional reference voltage $V_{RFP}$ is provided to the non-inverting input terminal of amplifier 172 whose output signal is provided to charge pump 166 to regulate its operation. Reference voltage $V_{RFP}$ can, for example, be the same as reference voltage $V_{REF}$. Components 168, 170, and 172 stabilize high voltage $V_{PA}$ at a largely fixed value.

The resistor segments in the implementation of FIG. 5 have the following resistances in one example:

TABLE I

| Resistor Segments | Resistance (Kohm) |
|---|---|
| 150 | 49 |
| $152_0$ | 5 |
| $152_1$ | 10 |
| $154_0$, $154_2$, $154_4$, and $154_6$ | 1 |
| $154_1$, $154_3$, $154_5$, and $154_7$ | 2 |
| 160 | 248 |
| $162_0$ | 20 |
| $162_1$ | 40 |

For bit-group size n being equal to 16 in the preceding example, there can be seventeen integer sets with a different one of integers 0, 1, . . . 16 in each set as follows for the case in which fuses $156_0$ and $156_1$ are intact so that the resistances of resistor segments $152_0$ and $152_1$ are not included in variable resistance $R_V$:

TABLE II

| Integer Set | Integer(s) in Set | $R_V$ (Kohm) |
|---|---|---|
| A | 0 | 61 |
| B | 1 | 60 |
| C | 2 | 59–60 |
| D | 3 | 58–59 |
| E | 4 | 57–59 |
| F | 5 | 57–58 |
| G | 6 | 56–58 |
| H | 7 | 56–57 |
| I | 8 | 55–57 |
| J | 9 | 55–56 |
| K | 10 | 55–56 |
| L | 11 | 54–55 |
| M | 12 | 53–55 |
| N | 13 | 53–54 |

TABLE II-continued

| Integer Set | Integer(s) in Set | $R_V$ (Kohm) |
|---|---|---|
| O | 14 | 52–53 |
| P | 15 | 53 |
| Q | 16 | 53 |

Because there is only one integer in each set here, that integer is the number of bits being programmed to logic "0" in a unitary group of cells 50 that receive a 16-bit unitary bit group such as a 16-bit word. The value of variable resistance $R_V$ varies slightly for certain of the integer sets because different combinations of the $V_{C0}$–$V_{C7}$ values lead to different ones of resistor segments $154_0$–$154_7$ being included in resistance $R_V$ for the same number of cells 50 being programmed to "0". By generating calculation component signals $V_{C0}$–$V_{C7}$ in such a way that no more than four of signals $V_{C0}$–$V_{C7}$ are at logic "1" at any time, low resistance value $R_{VL}$ is 53 Kohm even though resistance $R_V$ could be the lower value of 49 Kohm, the resistance of resistor segment 150, if all of signals $V_{C0}$–$V_{C7}$ were simultaneously at "1".

While the invention has been described with reference to particular embodiments, this description is solely for the purpose of illustration and is not be construed as limiting the scope of the invention claimed below. For instance, each memory cell 50 can be implemented with a p-channel floating-gate FET, typically of the split-gate type. The voltage polarities are then reversed from what is described above for implementing each cell 50 with an n-channel floating-gate FET. The $V_{PAS}$ adjusted programming voltage, source programming voltage $V_{PPS}$, control programming voltage $V_{PHC}$, and body erasure voltage $V_{EHB}$ are then all below low supply voltage $V_{SS}$ with the $V_{PAS}$ voltage and voltage $V_{PHC}$ all being more negative than $V_{PPS}$. Since programming signal $V_{PAS}$ is produced from supply programming signals $V_{PS0}$–$V_{PSm-1}$ in the implementation of FIG. 3 and from high voltage $V_{PA}$ in the implementation of FIG. 4, the $V_{PS0}$–$V_{PSm-1}$ voltages and voltage $V_{PA}$ in the p-channel memory-cell case are likewise below $V_{SS}$ and are more negative than source programming voltage $V_{PPS}$.

The situation of implementing memory cells 50 with p-channel floating-gate FETs has the following characteristics common to the situation of implementing cells 50 with n-channel floating-gate FETs. The $V_{PAS}$ programming voltage, source programming voltage $V_{PPS}$, and control programming voltage $V_{PHC}$, along with the $V_{PS0}$–$V_{PSm-1}$ voltages and voltage $V_{PA}$ for the implementations of FIGS. 3 and 4, are all outside the $V_{DD}$–$V_{SS}$ supply range during a programming/write operation in which the bits of bit-group signal B are simultaneously written into a unitary group of cells 50.

For the voltage-regulating implementation of FIG. 4, programming voltage $V_{PAS}$ at writing supply terminal $T_{WR}$ changes progressively, i.e., increases progressively in the n-channel cell case or decreases progressively in the p-channel cell case, as the voltage difference across resistors 130 and 132 progressively increases. With the $V_{PAS}$ adjusted programming voltage and source programming voltage $V_{PPS}$ being further away from a specified one of supply voltages $V_{DD}$ and $V_{SS}$ than the remaining one of voltages $V_{DD}$ and $V_{SS}$, control programming voltage $V_{PHC}$ is further away from the specified supply voltage than the remaining supply voltage and is also further away from both supply voltages than is the $V_{PAS}$ voltage or voltage $V_{PPS}$.

Taking note of the fact that EPROMs are non-volatile rewritable memories, the adjusting techniques of the invention can be applied to volatile rewritable memories such as semiconductor random-access memories. The memory cells of such a volatile rewritable memory are typically cleared (or erased) before a writing operation. Various modifications and applications may thus be made by those skilled in the art without departing from the true scope of the invention as defined in the appended claims.

We claim:

1. A memory comprising:
    a multiplicity of memory cells allocated into multiple cell groups, each containing at least two of the cells for respectively storing bits of a bit group, each bit being in a first logic state or a second logic state opposite to the first logic state;
    a plurality of writing electrical conductors, all the cells in a cell group electrically connected to an associated one of the writing conductors; and
    writing circuitry for adjusting how much current or/and voltage is provided to each writing conductor for simultaneously writing the bits of a bit group into the cells of a cell group associated with that writing conductor as a function of how many of those bits are in the first logic state.

2. A memory as in claim 1 further including clearing circuitry, potentially including part of the writing circuitry, for placing all the cells in a cell group in the second logic state prior to writing a bit group into that cell group.

3. A memory as in claim 2 further including reading circuitry, potentially including parts of the writing and clearing circuitries, for reading bit groups stored in the cell groups.

4. A memory as in claim 1 wherein each bit group is a word or a byte.

5. A memory as in claim 1 wherein the writing circuitry comprises:
    a calculating circuit which, for the bits of a bit group that are to be simultaneously written into the cells of a cell group associated with a writing conductor and with respect to a plurality of integer sets each containing at least one integer where the integers in any of the integer sets containing multiple integers are consecutive integers, (a) determines which integer set contains an integer equal to the number of those bits in the first logic state and (b) generates a calculation signal indicative of that determination; and
    an adjusting circuit for supplying current or/and voltage to that writing conductor at a current amount or/and voltage amount adjusted in response to the calculation signal.

6. A memory as in claim 5 wherein each bit group is of the same bit size as each other bit group, the integers in all the integer sets together running sequentially from zero to the number of bits in each bit group.

7. A memory as in claim 5 wherein each integer in each integer set is different from each integer in each other integer set.

8. A memory as in claim 5 wherein each integer set contains at least two different consecutive integers.

9. A memory as in claim 5 wherein the calculating circuit determines how many of the bits in a bit group being simultaneously written into the cells of a cell group are in the first logic state.

10. A memory as in claim 5 wherein the adjusting circuit has a writing supply terminal selectively electrically connectable to each writing conductor, current or/and voltage for simultaneously writing the bits of a bit group into the cells of a cell group associated with a writing conductor being provided at the writing supply terminal for that writing conductor.

11. A memory as in claim 10 wherein at least two different non-zero values of current are providable at the writing supply terminal.

12. A memory as in claim 10 wherein the adjusting circuit progressively increases how much current is provided at the writing supply terminal as the number of bits that are in the first logic state in a bit group whose bits are being simultaneously written into a cell group increases in integer increments corresponding to the integer sets.

13. A memory as in claim 10 wherein the adjusting circuit comprises a plurality of current-supply components having respective supply electrical conductors coupled together and to the writing supply terminal for providing current at the writing supply terminal, each current-supply component providing its supply conductor with a non-zero supply current in response to a specified condition of a corresponding different component signal of the calculation signal.

14. A memory as in claim 10 wherein at least three different values of voltage are providable at the writing supply terminal.

15. A memory as in claim 10 wherein the adjusting circuit adjusts the voltage provided at the writing supply terminal so that, due to voltage losses in intervening circuitry by which the writing supply terminal is selectively electrically connected to each writing conductor, the voltage on each writing conductor is approximately the same regardless of how many bits being simultaneously written into the cells of a cell group along that writing conductor are in the first logic state.

16. A memory as in claim 10 wherein the adjusting circuit comprises an adjusting component that provides a component voltage difference which progressively increases as the number of bits that are in the first logic state in a bit group whose bits are simultaneously written into the cells of a cell group increases in integer increments corresponding to the integer sets, the voltage at the writing supply terminal either increasing or decreasing in a corresponding manner with the component voltage difference.

17. A memory as in claim 10 wherein the memory is electrically coupled between a pair of sources of different supply voltages whose difference defines a supply voltage range, the voltage at the writing supply terminal being outside the supply voltage range when the bits of a bit group are being written simultaneously into the cells of a cell group.

18. A memory as in claim 17 wherein the writing circuitry includes voltage-enhancing circuitry that causes the voltage at the writing supply terminal to be outside the supply voltage range for writing the bits of a bit group simultaneously into the cells of a cell group.

19. A memory as in claim 17 wherein the writing circuitry comprises:
 a calculating circuit which, for the bits of a bit group that are to be simultaneously written into the cells of a cell group and with respect to a plurality of integer sets each containing at least one integer where the integers in any of the integer sets containing multiple integers are consecutive integers, (a) determines which integer set contains an integer equal to the number of those bits in the first logic state and (b) generates a calculation signal indicative of that determination; and
 an adjusting/voltage-enhancing circuit for supplying current or/and voltage to the writing supply terminal at a current amount or/and voltage amount adjusted in response to the calculation signal such that the voltage at the writing supply terminal is outside the supply voltage range for simultaneously writing the bits of a bit group into the cells of a cell group.

20. A memory as in claim 19 wherein, when the bits of a bit group are to be simultaneously written into the cells of a cell group, the adjusting/voltage-enhancing circuit progressively increases how much current is provided at the writing supply terminal as the number of those bits in the first logic state increases in integer increments corresponding to the integer sets.

21. A memory as in claim 19 wherein the adjusting/voltage-enhancing circuit comprises a plurality of current-supply components having respective supply electrical conductors coupled together and to the writing supply terminal for providing current at the writing supply terminal, each current-supply component providing its supply conductor with a non-zero supply current at a voltage outside the supply range in response to a specified condition of a corresponding different component signal of the calculation signal.

22. A memory as in claim 19 wherein the adjusting/voltage-enhancing circuit adjusts the voltage provided at the writing supply terminal so that, due to voltage losses in intervening circuitry by which the writing supply terminal is selectively electrically connected to each writing conductor, the voltage on each writing conductor is at approximately the same value outside the supply voltage range regardless of how many bits being simultaneously written into the cells of a cell group along that writing conductor are in the first logic state.

23. A memory as in claim 19 wherein the adjusting/voltage-enhancing circuit comprises an adjusting component that provides a component voltage difference which progressively increases as the number of bits that are in the first logic state in a bit group whose bits are simultaneously written into the cells of a cell group increases in integer increments corresponding to the integer sets, the voltage at the writing supply terminal changing progressively with the component voltage difference so as to be outside the supply voltage range.

24. A memory as in claim 23 wherein the adjusting component comprises a variable resistor whose resistance varies in response to the calculation signal.

25. An electrically erasable programmable read-only memory ("EPROM") electrically coupled between a pair of sources of different first and second supply voltages whose difference defines a supply voltage range, the EPROM comprising:
 a multiplicity of memory cells allocated into multiple cell groups, each containing at least two of the cells for respectively storing bits of a bit group, each bit being in a first logic state or a second logic state opposite to the first logic state;
 a plurality of writing electrical conductors, all the cells in each cell group electrically connected to an associated one of the writing conductors;
 writing circuitry for adjusting how much programming current or/and voltage is provided to each writing conductor for simultaneously writing the bits of a bit group into the cells of a cell group associated with that writing conductor as a function of how many of those bits are in the first logic state such that the programming voltage is then outside the supply voltage range;
 erasing circuitry, potentially including part of the writing circuitry, for placing all the cells of each cell group in the second logic state prior to writing a bit group into that cell group; and reading circuitry, potentially including part of the writing and erasing circuitries, for reading bit groups stored in the cell groups.

26. An EPROM as in claim 25 wherein the writing circuitry includes voltage-enhancing circuitry that causes the programming voltage to be outside the supply voltage range for writing the bits of a bit group simultaneously into the cells of a cell group.

27. An EPROM as in claim 25 wherein each bit group is a word or a byte.

28. An EPROM as in claim 25 wherein the writing circuitry comprises:

a calculating circuit which, for the bits of a bit group that are to be simultaneously written into the cells of a cell group associated with a writing conductor and with respect to a plurality of integer sets each containing at least one integer where the integers in any of the integer sets containing multiple integers are consecutive integers, (a) determines which integer set contains an integer equal to the number of those bits in the first logic state and (b) generates a calculation signal indicative of that determination; and an adjusting/voltage-enhancing circuit for supplying current or/and voltage to that writing conductor at a current amount or/and voltage amount adjusted in response to the calculation signal such that the programming voltage is outside the supply voltage range for simultaneously writing the bits of a bit group into the cells of a cell group.

29. An EPROM as in claim 28 wherein each integer in each integer set is different from each integer in each other integer set.

30. An EPROM as in claim 28 wherein the adjusting/voltage-enhancing circuit has a writing supply terminal selectively electrically connectable to each writing conductor, current or/and voltage for simultaneously writing the bits of a bit group into the cells of a cell group associated with a writing conductor being provided at the writing supply terminal for that writing conductor.

31. An EPROM as in claim 30 wherein each cell contains a variable-threshold field-effect transistor that comprises (a) a first source/drain region, (b) a second source/drain region, (c) a channel region extending between the source/drain regions, (d) a floating gate overlying the channel region and extending over part of the first source/drain region, (e) a control gate overlying the floating gate, and (f) a select gate overlying the channel region and extending over part of the second source/drain region, each of the gates electrically insulated from each other gate and from the channel region, one of the source/drain regions coupled to the writing conductor for that cell.

32. An EPROM as in claim 31 wherein the programming voltage is further away from a specified one of the supply voltages than from the remaining one of the supply voltages, the adjusting/voltage-enhancing circuit including a decoder (a) for electrically connecting the writing supply terminal to the writing conductor for a selected cell group for simultaneously writing the bits of a bit group into the cells of the selected cell group and (b) for substantially providing the specified supply voltage to each other writing conductor.

33. An EPROM as in claim 32 wherein the writing circuitry includes:

voltage-generating circuitry for generating an additional programming voltage outside the supply voltage range, the additional programming voltage being further away from the specified supply voltage than the remaining supply voltage and also being further away from both supply voltages than the programming voltage at the writing supply terminal; and an additional decoder (a) for substantially providing the additional programming voltage to the control gates of the transistors in the cells of the selected cell group and (b) for substantially providing the specified supply voltage to the control gates of the transistors in the cells connected to the writing conductors other than the writing conductor connected to the cells in the selected cell group.

34. An EPROM as in claim 33 wherein the writing circuitry further includes bit programming circuitry for substantially providing the second source/drain regions of the transistors in the cells of the selected cell group with (a) the specified supply voltage for each cell whose bit is to be in the first logic state and (b) the remaining supply voltage for each cell whose bit is to be in the second logic state.

35. An EPROM as in claim 30 wherein the adjusting/voltage-enhancing circuit comprises charge-pumping circuitry for generating a voltage outside the supply voltage range in producing the programming voltage at the writing supply terminal.

36. An EPROM as in claim 30 wherein at least two different non-zero values of the programming current are providable at the writing supply terminal.

37. An EPROM as in claim 30 wherein, when the bits of a bit group are to be simultaneously written into the cells of a cell group, the adjusting/voltage-enhancing circuitry progressively increases how much programming current is provided at the writing supply terminal at the programming voltage as the number of those bits in the first logic state increases in integer increments corresponding to the integer sets.

38. An EPROM as in claim 30 wherein the adjusting/voltage-enhancing circuit comprises a plurality of current-supply components having respective supply electrical conductors coupled together and to the writing supply terminal for providing the programming current at the writing supply terminal, each current-supply component providing its supply conductor with a non-zero supply current at a voltage outside the supply range in response to a specified condition of a corresponding different component signal of the calculation signal.

39. An EPROM as in claim 30 wherein at least three different values of the programming voltage are providable at the writing supply terminal.

40. An EPROM as in claim 30 wherein the adjusting/voltage-enhancing circuit adjusts the programming voltage so that, due to voltage losses in intervening circuitry by which the writing supply terminal is selectively electrically connected to each writing conductor, the voltage on each writing conductor is at approximately the same value outside the supply voltage range regardless of how many bits being simultaneously written into the cells of each cell group along that writing conductor are in the first logic state.

41. An EPROM as in claim 30 wherein the adjusting/voltage-enhancing circuit comprises an adjusting component that provides a component voltage difference which progressively increases as the number of bits that are in the first logic state in a bit group whose bits are simultaneously written into the cells of a cell group increases in integer increments corresponding to the integer sets, the programming voltage either increasing or decreasing in a corresponding manner with the component voltage difference so as to be outside the supply voltage range.

42. An EPROM as in claim 41 wherein the adjusting component comprises a variable resistor whose resistance varies in response to the calculation signal.

43. An EPROM as in claim 42 wherein the variable resistor comprises:
   a plurality of resistor segments arranged in series; and
   a plurality of switches respectively corresponding to the resistor segments, each switch electrically connected across the corresponding resistor segment and being responsive to a different component signal of the calculation signal such that current flows through each switch when that switch is closed or through the corresponding resistor segment when that switch is open.

44. An EPROM as in claim 43 wherein each switch comprises a field-effect transistor.

45. A method comprising:
   providing a memory in which a multiplicity of memory cells are allocated into multiple cell groups, each group contains at least two of the cells for respectively storing bits of a bit group, each bit is in a first logic state or a second logic state opposite to the first logic state, and all the cells in a cell group are electrically connected to an associated one of a plurality of writing electrical conductors; and
   adjusting how much current or/and voltage is provided to each writing conductor for simultaneously writing the bits of a bit group into the cells of a cell group associated with that writing conductor as a function of how many of those bits are in the first logic state.

46. A method as in claim 45 wherein, for the bits of a bit group that are to be simultaneously written into the cells of a cell group associated with a writing conductor and with respect to a plurality of integer sets each containing at least one integer where the integers in any of the integer sets containing multiple integers are consecutive integers, the adjusting act comprises:
   determining which integer set contains an integer equal to the number of those bits in the first logic state;
   generating a calculation signal indicative of that determination; and
   supplying current or/and voltage to that writing conductor associated with that cell group at a current amount or/and voltage amount adjusted in response to the calculation signal.

47. A method comprising:
   providing an electrically erasable programmable read-only memory ("EPROM") in which the EPROM is electrically coupled between a pair of sources of different first and second supply voltages whose difference defines a supply voltage range, a multiplicity of memory cells are allocated into multiple cell groups, each cell group contains at least two of the cells for respectively storing bits of a bit group, each bit is in a first logic state or a second logic state opposite to the first logic state, and all the cells in each cell group are electrically connected to an associated one of a plurality of writing electrical conductors;
   adjusting how much programming current or/and voltage is provided to each writing conductor for simultaneously writing the bits of a bit group into the cells of a cell group associated with that writing conductor as a function of how many of those bits are in the first logic state such that the programming voltage is then outside the supply voltage range;
   placing all the cells of each cell group in the second logic state prior to writing a bit group into that cell group; and
   reading bit groups stored in the cell groups.

48. A method as in claim 47 wherein, for the bits of a bit group that are to be simultaneously written into the cells of a cell group associated with a writing conductor and with respect to a plurality of integer sets each containing at least one integer where the integers in any of the integer sets containing multiple integers are consecutive integers, the adjusting act comprises:
   determining which integer set contains an integer equal to the number of those bits in the first logic state;
   generating a calculation signal indicative of that determination; and
   supplying current or/and voltage to that writing conductor associated with that cell group at a current amount or/and voltage amount adjusted in response to the calculation signal.

49. An EPROM as in claim 28 wherein each bit group is of the same bit size as each other bit group, the integers in all the integer sets together running sequentially from zero to the number of bits in each bit group.

50. An EPROM as in claim 28 wherein the calculating circuit determines how many of the bits in a bit group being simultaneously written into the cells of a cell group are in the first logic state.

51. A method as in claim 45 further including placing all the cells in a cell group in the second logic state immediately prior to writing a bit group into that cell group.

52. A method as in claim 45 further including reading bit groups stored in the cell groups.

53. A method as in claim 46 wherein the supplying act comprises:
   selectively electrically connecting a writing conductor to a writing supply terminal common to the writing conductors; and
   furnishing the writing supply terminal with current or/and voltage for simultaneously writing the bits of a bit group into the cells of a cell group associated with the so-connected writing conductor.

54. A method as in claim 53 wherein the furnishing act comprises increasing how much current is provided at the writing supply terminal as the number of bits that are in the first logic state in a bit group whose bits are being simultaneously written into a cell group increases in integer increments corresponding to the integer sets.

55. A method as in claim 53 wherein the furnishing act comprises adjusting the voltage provided at the writing supply terminal so that, due to voltage losses in circuitry which selectively electrically connects the writing supply terminal to each writing conductor, the voltage on each writing conductor is approximately the same regardless of how many bits being simultaneously written into the cells of a cell group along that writing conductor are in the first logic state.

56. A method as in claim 53 wherein the furnishing act comprises:
   providing a voltage difference which progressively increases as the number of bits that are in the first logic state in a bit group whose bits are simultaneously written into the cells of a cell group increases in integer increments corresponding to the integer sets; and
   increasing or decreasing the voltage at the writing supply terminal in a manner corresponding to the voltage difference.

57. A method as in claim 48 wherein the supplying act comprises:
- selectively electrically connecting a writing conductor to a writing supply terminal common to the writing conductors; and
- furnishing the writing supply terminal with current or/and voltage for simultaneously writing the bits of a bit group into the cells of a cell group associated with the so-connected writing conductor.

58. A method as in claim 57 wherein the furnishing act comprises increasing how much current is provided at the writing supply terminal as the number of bits that are in the first logic state in a bit group whose bits are being simultaneously written into a cell group increases in integer increments corresponding to the integer sets.

59. A method as in claim 57 wherein the furnishing act comprises adjusting the voltage provided at the writing supply terminal so that, due to voltage losses in circuitry which selectively electrically connects the writing supply terminal to each writing conductor, the voltage on each writing conductor is approximately the same regardless of how many bits being simultaneously written into the cells of a cell group along that writing conductor are in the first logic state.

60. A method as in claim 55 wherein the furnishing act comprises:
- providing a voltage difference which progressively increases as the number of bits that are in the first logic state in a bit group whose bits are simultaneously written into the cells of a cell group increases in integer increments corresponding to the integer sets; and
- increasing or decreasing the voltage at the writing supply terminal in a manner corresponding to the voltage difference.

\* \* \* \* \*